United States Patent
Tsironis (10) Patent No.: US 12,181,514 B1
(45) Date of Patent: Dec. 31, 2024

(54) DIRECTIONAL SIGNAL COUPLER-DIVIDER

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 140 days.

(21) Appl. No.: 17/966,728

(22) Filed: Oct. 14, 2022

(51) Int. Cl.
*G01R 31/26* (2020.01)
*G01R 27/04* (2006.01)
*G01R 27/26* (2006.01)
*G01R 27/28* (2006.01)
*G01R 27/32* (2006.01)
*G01R 31/28* (2006.01)
*G01R 35/00* (2006.01)
*H01P 5/18* (2006.01)

(52) U.S. Cl.
CPC .......... *G01R 31/2822* (2013.01); *H01P 5/183* (2013.01)

(58) Field of Classification Search
CPC ................ G01R 31/26; G01R 31/2601; G01R 31/2607; G01R 31/28; G01R 31/2822; G01R 27/04; G01R 27/26; G01R 27/28; G01R 27/32; G01R 35/00; H01P 5/18; H01P 5/183
See application file for complete search history.

(56) References Cited

U.S. PATENT DOCUMENTS

| | | | |
|---|---|---|---|
| 7,135,941 B1 | 11/2006 | Tsironis | |
| 7,282,926 B1 * | 10/2007 | Verspecht | H01P 5/04 324/641 |
| 7,548,069 B2 | 6/2009 | Simpson et al. | |
| 11,137,439 B1 * | 10/2021 | Tsironis | G01R 35/005 |

OTHER PUBLICATIONS

Load Pull for Power Devices [online], Microwaves 101 [retrieved on Mar. 14, 2017]. Retrieved from Internet <URL: https://www.microwaves101.com/encyclopedias/ load-pull-for-power-devices>.
"Computer Controlled Microwave Tuner", Product Note 41, Focus Microwaves, Jan. 1998.
"Microstrip" [online], Wikipedia [retrieved on Apr. 28, 2020]. Retrieved from Internet <URL: https://en.wikipedia.org/wiki/Microstrip>.
S-parameters [online], Microwaves 101 [retrieved on Apr. 28, 2020]. Retrieved from Internet <URL: https://www.microwaves101.com/encyclopedias/s-parameters>.
Directional Couplers [online], Microwaves 101 [retrieved on Oct. 17, 2018]. Retrieved from Internet <URL: http://www.microwaves101.com/encyclopedia/directionalcouplers.cfm>.

* cited by examiner

*Primary Examiner* — Neel D Shah (57) ABSTRACT

Low loss high directivity signal couplers use one or two U-shaped wire loops inserted into a slot of a low loss transmission line; the low diameter coaxial cable ending in wire loop sensors, which are inserted into the slot of the transmission line lead to a coupled, an isolated and a divided port. High, capacitively induced, electrical current, because of the proximity between the signal conductor of the airline and the wire loop, compares favorably with the antiphase magnetically induced current component in the wire loop sensor and leads to increased coupling, division and directivity over a wide frequency range starting at a few hundred MHz and exceeding 18 GHz. The signal coupler-divider is used in hybrid load pull tuners with instantaneous vector signal measurement capability.

3 Claims, 9 Drawing Sheets

DIRECTIONAL SIGNAL COUPLER-DIVIDER

PRIORITY CLAIM

Not Applicable

CROSS-REFERENCE TO RELATED ARTICLES

1. Load Pull for Power Devices [online], Microwaves101 [retrieved on 2017 Mar. 14]. Retrieved from Internet <URL: https://www.microwaves101.com/encyclopedias/load-pull-for-power-devices>.
2. "Computer Controlled Microwave Tuner", Product Note 41, Focus Microwaves, January 1998.
3. Microstrip [online], Wikipedia [retrieved on 2020 Apr. 28]. Retrieved from Internet <URL: https://en.wikipedia.org/wiki/Microstrip>.
4. S-parameters [online], Microwaves101 [retrieved on 2020 Apr. 28]. Retrieved from Internet <URL: https://www.microwaves101.com/encyclopedias/s-parameters>.
5. Directional Couplers [online], Microwaves 101 [retrieved on 2018 Oct. 17]. Retrieved from Internet <URL: http://www.microwaves101.com/encyclopedia/directionalcouplers.cfm>.
6. Verspecht et al., U.S. Pat. No. 7,282,926, "Method and an apparatus for characterizing a high-frequency device-under-test in a large signal impedance tuning environment".
7. Simpson, G., U.S. Pat. No. 7,548,069, "Signal Measurement Systems and Methods".
8. Tsironis, C., U.S. Pat. No. 11,137,439, "Hybrid Load and Source tuner using digital active loop", FIG. 5.
9. Tsironis, C., U.S. Pat. No. 7,135,941, "Triple probe automatic slide screw load pull tuner and method".

FIELD OF THE INVENTION

This invention relates to testing of microwave two-ports (transistors, device under test (DUT)) using linear and non-linear measurement techniques especially under controlled impedances at the input and output of the transistors (load Pull measurement, see ref. 1) and also measuring and analyzing the large signal behavior of a DUT.

BACKGROUND OF THE INVENTION

Figure 1:
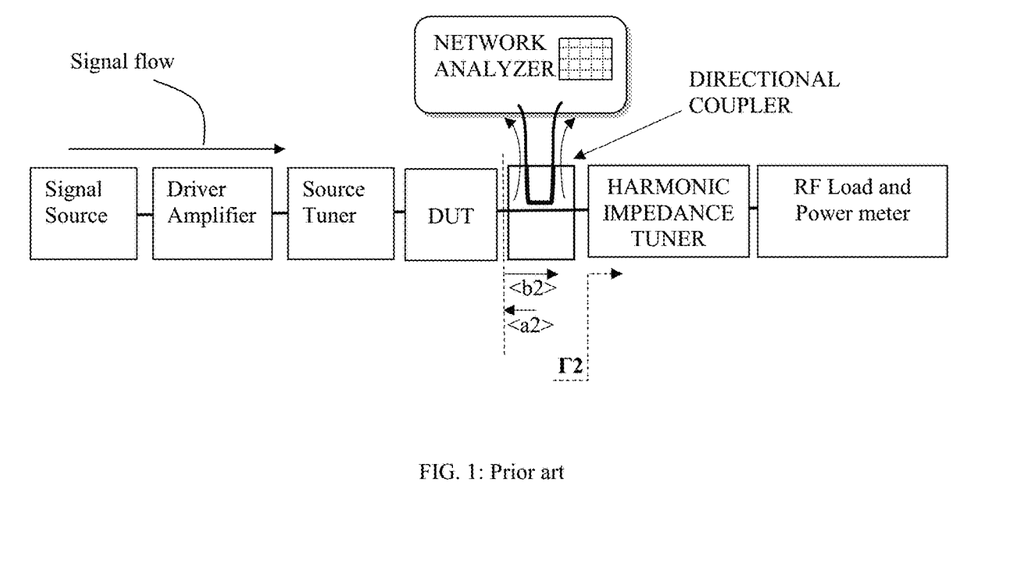
FIG. 1 depicts prior art, a vector load pull test setup for measuring power contours and real time incident and reflected waves and load reflection factor of a DUT, using bi-directional coupler and network analyzer.

A popular method for testing and characterizing microwave transistors at high power nonlinear operation is "load pull" and "source pull" (see ref. 1). Load pull or source pull are measurement techniques employing microwave tuners (see ref. 2) and other microwave test equipment. The microwave tuners in particular are used to manipulate the microwave impedance conditions under which the Device Under Test (DUT, or transistor) is tested (FIG. 1). Directional signal couplers are needed to detect the signal waves propagating along the transmission line towards <a> and away <b> from the DUT (FIG. 1) and to allow performing harmonic Fourier analysis (see ref. 9) in order to reconstruct the real-time non-linear transistor response. Further-on the instantaneous voltage-current trajectory of a transistor, typically called the "load-line", (see ref. 6) will depend on the complex impedance presented to the transistor using harmonic tuners (see ref. 9). A setup that allows this test is a "harmonic load pull setup" as shown in FIG. 1.

DESCRIPTION OF PRIOR ART

Figure 2:
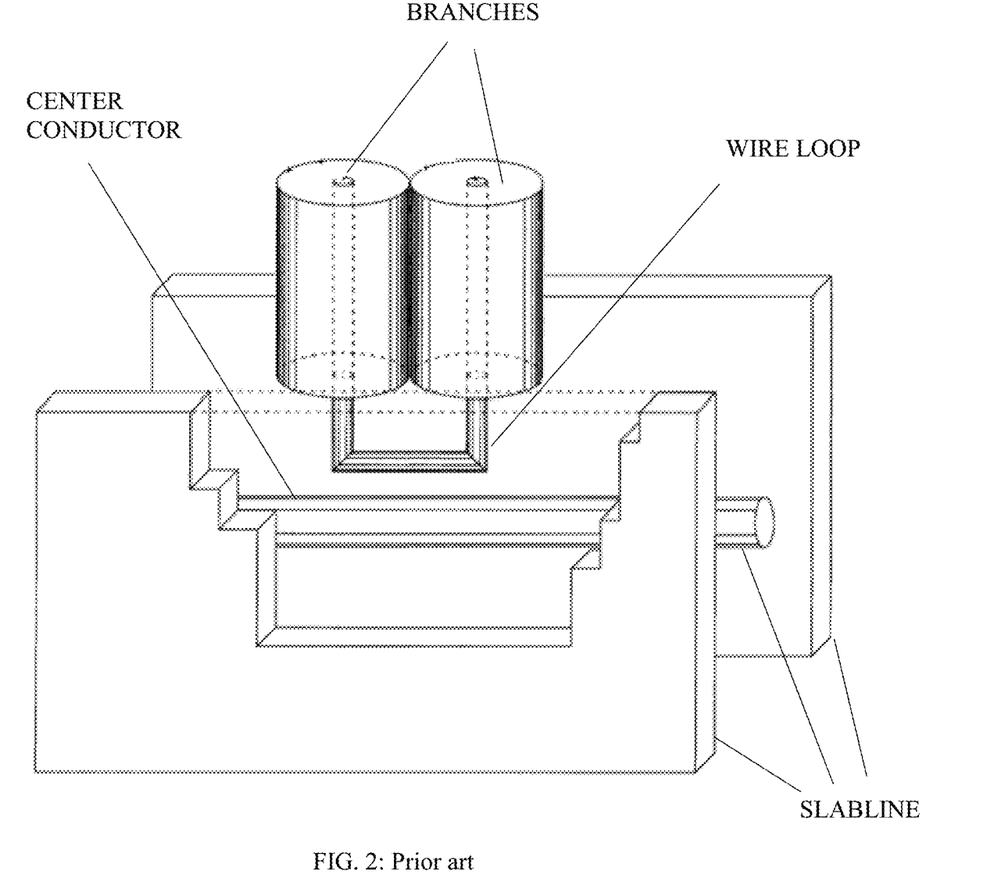
FIG. 2 depicts prior art, signal coupler of type "wave-probe".
Figure 4:
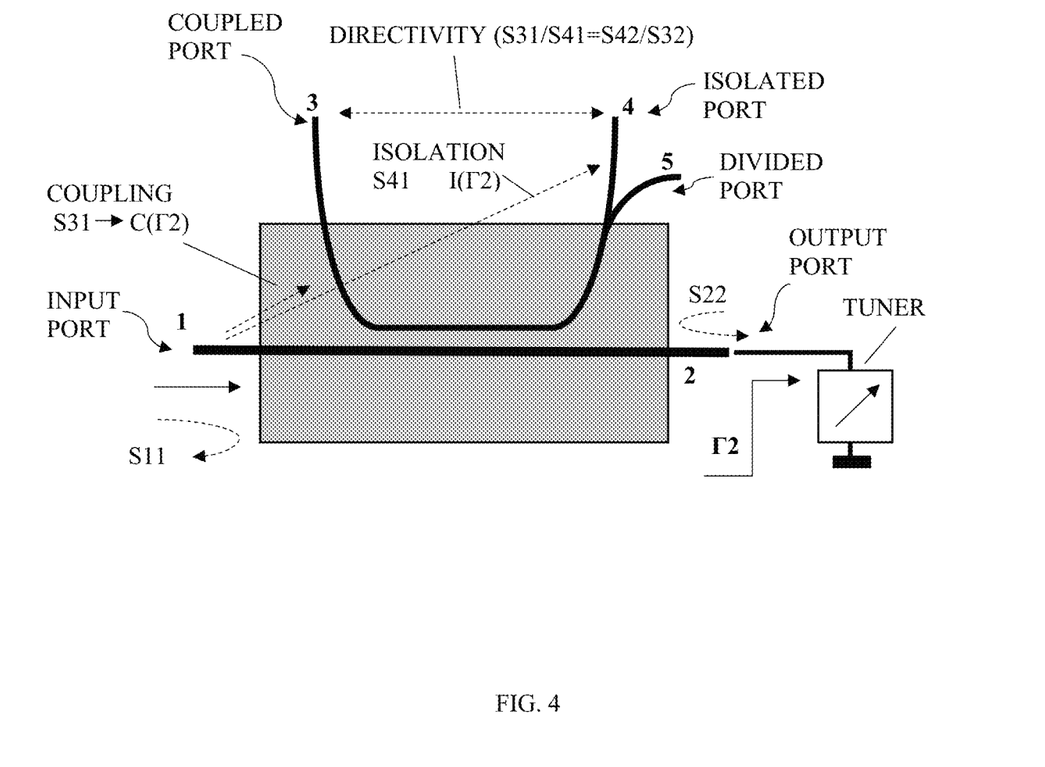
FIG. 4 depicts prior art, definition of transmission, reflection, division and coupling RF parameters in a directional coupler.
Figure 7:
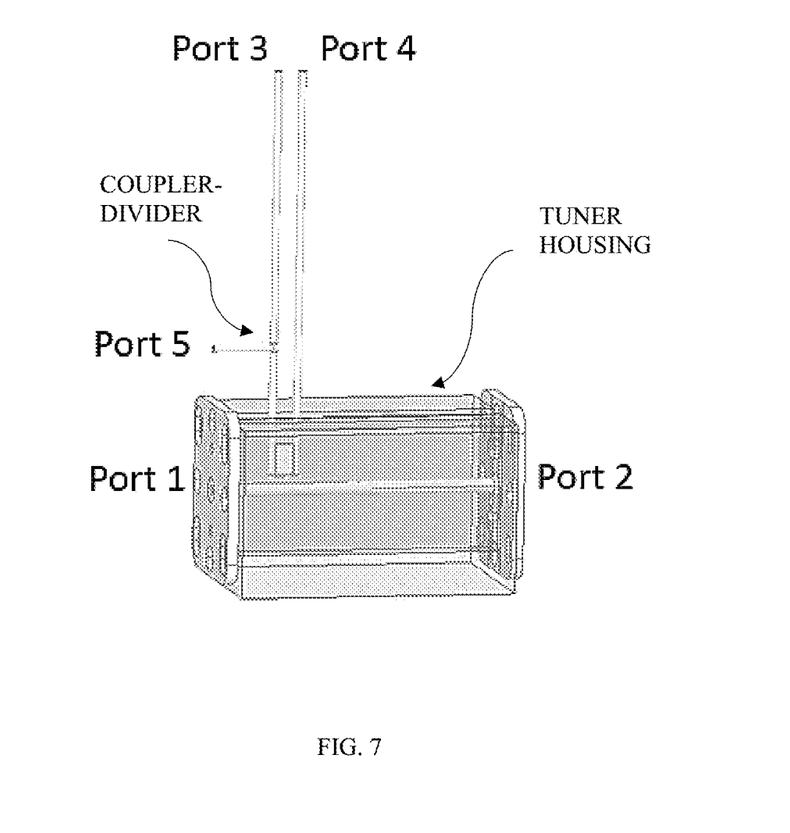
FIG. 7 depicts an embodiment of the wideband signal coupler divider integrated in an impedance tuner housing.

Directional signal couplers have been known (see ref. 5); wideband wire couplers have been introduced later (see ref. 6 and FIG. 2); they detect forward <a> and reverse <b> travelling waves on the transmission line and transfer the measured data to the VNA (FIG. 1). In order for the data to be valid, the couplers must be calibrated by measuring their scattering (s-) parameters before (see ref. 4) and de-embed to the DUT reference plane. Typical s-parameter calibration occurs under 50Ω termination conditions. However, when the terminations are non-50Ω, as shown in FIG. 4, the signal sampling behavior, forward $C(\Gamma 2)$ (coupling) and reverse $I(\Gamma 2)$ (isolation) and divided $D(\Gamma 2)$ change. The signal detected at the coupled port comes from both the input port and, as part of the signal returning from a non-50Ω termination ($\Gamma 2$), at the output port. In load pull operations in particular the tuners create (on purpose) non-50Ω test conditions. The relation describing this phenomenon using 5-port s-parameters (see ref. 4) is:

$$C(\Gamma 2)=S31+S32*S21*\Gamma 2/(1-\Gamma 2*S22) \approx S31+S32*\Gamma 2 \quad \{eq. 1\}$$

$$I(\Gamma 2)=S41+S42*S21*\Gamma 2/(1-\Gamma 2*S22) \approx S41+S42*\Gamma 2 \quad \{eq. 2\}$$

whereby $\Gamma 2$ is the reflection created by the tuner at port 2 and $C(\Gamma 2)$ and $I(\Gamma 2)$ are the new values of the transmission S31 and isolation S41 between port 1 and ports 3 and 4 or the ratio of signal power detected at ports 3 and 4 divided by the injected signal power into port 1 (FIG. 7). The Directivity is a coupler property defined as S31/S41=S42/S32, depending which port, 1 or 2, is defined as the input port. If $\Gamma 2$=0 then $C(0)$=S31 and $I(0)$=S41 as follows from {eq.1, 2}. The important quantities are S32 and $\Gamma 2$, that is the isolation and the load reflection factor; since $|S21|\approx 1$, and $|S22|\approx 0$ it is, finally, the product $\Gamma 2*S32$ that determines the sensitivity of the coupling factor on the mismatch created by the tuner. An ideal directivity coupler should therefore have a Directivity of infinite, or S41=S32=0. This not being possible, "Directivity" is a key and distinguishing performance of any directional coupler, especially when used in a non-50Ω, i.e., $|\Gamma 2|>0$ test environment as shown in FIGS. 1 and 7. Commercially available compact wideband couplers (see ref. 5) have Directivity values between 10 and 20 dB. The coupler presented here is simpler to make, is extremely wideband and exceeds this level of Directivity.

BRIEF DESCRIPTION OF THE INVENTION

Figure 6:
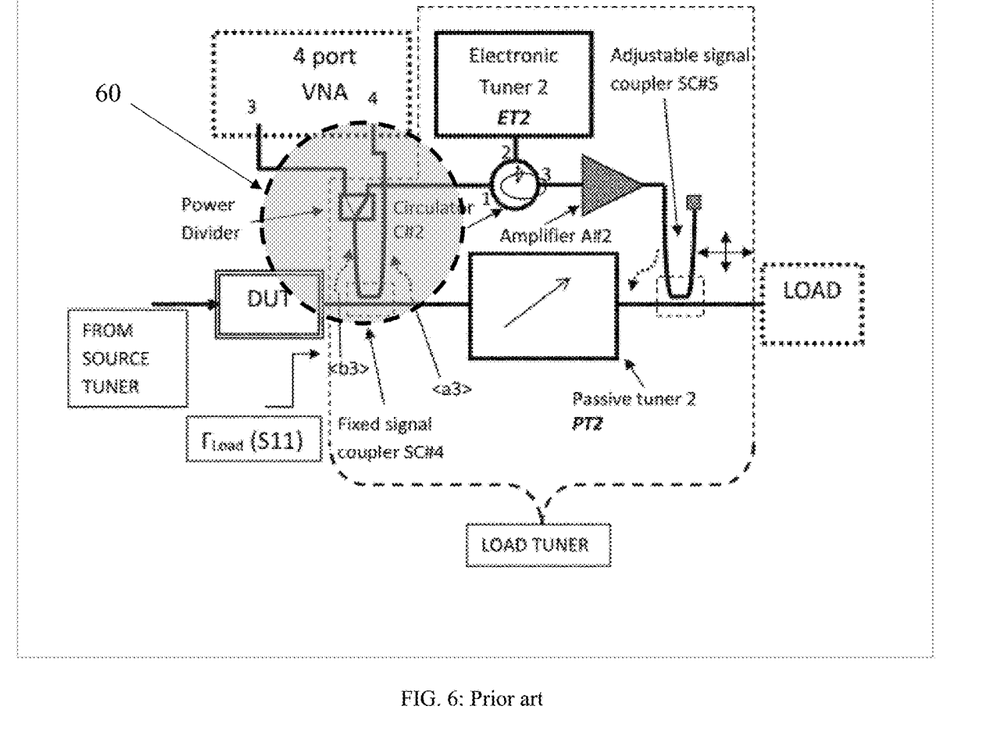
FIG. 6 depicts a detail of an embodiment of the signal coupler-divider in a hybrid load pull system (see ref. 8).

Signal couplers are in general bi-directional. When the isolated port (FIG. 4) is terminated with characteristic impedance, i.e. no signal is reflected back into the coupler, it is called a directional coupler, because the larger portion of the detected signal comes from one direction (forward). Of course, because the couplers are bi-directional, in reverse direction the isolated port becomes the coupled port, and the coupled port becomes the isolated port. The couplers dealt with in this disclosure are bi-directional couplers. In some cases, the detected signal is needed to drive a feedback network, as well as, to be measured by a vector network analyzer (VNA), FIG. 6 in order to perform vector load pull. In this case one branch of the "U" sensor is split into a detection (coupled) port and a feedback (divided) port (FIG. 4); the simplest solution is to split the coupled signal offering the benefit of compactness and relaxed parallelism requirements, which are mandatory in a slotted airline or slabline. Directivity data of prior art IV couplers (IV probes, see ref. 7) are known to be inferior. The coupler is made by inserting a U-shaped electro-magnetic wire loop sensor into a hole in the mantle of a coaxial airline or the channel between the sidewalls of the slabline, coupling contactless with the signal conductor and extending its branches to coaxial cables leading to the coupled, isolated and divided coaxial ports.

BRIEF DESCRIPTION OF THE SEVERAL VIEWS OF THE DRAWINGS

The invention and its mode of operation will be more clearly understood from the following detailed description when read with the appended drawings in which:

FIGS. 9A through 9B depict a second embodiment of the signal coupler-divider using two adjacent U-shaped wire loops: FIG. 9A depicts the concept; FIG. 9B depicts coupling behavior from 0.4 to 4 GHz.

DETAILED DESCRIPTION OF THE INVENTION

The directional signal coupler-divider uses a slotted low loss transmission airline or a slabline which is popular in air-based couplers (see ref. 5 and 6). The advantages offered by this method are twofold: a) it is mechanically simpler than a microstrip line (see ref. 3); b) it offers an in-situ embodiment of a divided port. The strong concentration of electric field in the zone between signal conductor and close-by wire loop (FIG. 3) leads to higher induced electric currents, in the wire loop sensor, which increases the coupled signal and decreases the isolated signal, thus increasing the coupling and directivity at the same time. If one branch is split, FIG. 4, adding a fifth port 5, the simple bi-directional signal coupler becomes a coupler-divider. The quantity describing this is called division $D(\Gamma 2)$ as follows equations 1 and 2:

$$D(\Gamma 2)=S51+S52*S21*\Gamma 2/(1-\Gamma 2*S22)\approx S51+S52*\Gamma 2 \quad \{eq. 3\}$$

If S51=0 then, as before, $D(\Gamma 2)=S52*\Gamma 2$.

The coupling and isolation mechanism, first described in ref. 6 works as follows (FIG. 3): the RF signal current Is inside the signal conductor 30 creates a magnetic field H around it. This pulsing magnetic field H, 32 couples into the parallel running wire loop sensor 31-33 and creates a magnetically induced current $I_H$ which flows from branch 33 through the bottom of the "U" shaped loop 34 into branch 31. Since the bottom of the wire loop sensor runs parallel to the signal conductor 30 there is a capacitive coupling between the two. This capacitive coupling induces, capacitive current $I_E$ into either 50 Ohm terminated branches 31 and 33. These currents are proportional to the electric field in this region. Inside branch 33 the magnetically induced current $I_H$ and the electric one $I_E$ add yielding a total current $I_H+I_E$. Inside branch 31 these currents run antiphase and subtract. The total signal power in the load to branch 33 is therefore $|I_E+I_H|^2*Zo$ and in branch 31 $|I_H-I_E|^2*Zo$. This creates both the forward coupling into branch 33 and the isolation in branch 31.

Figure 3:
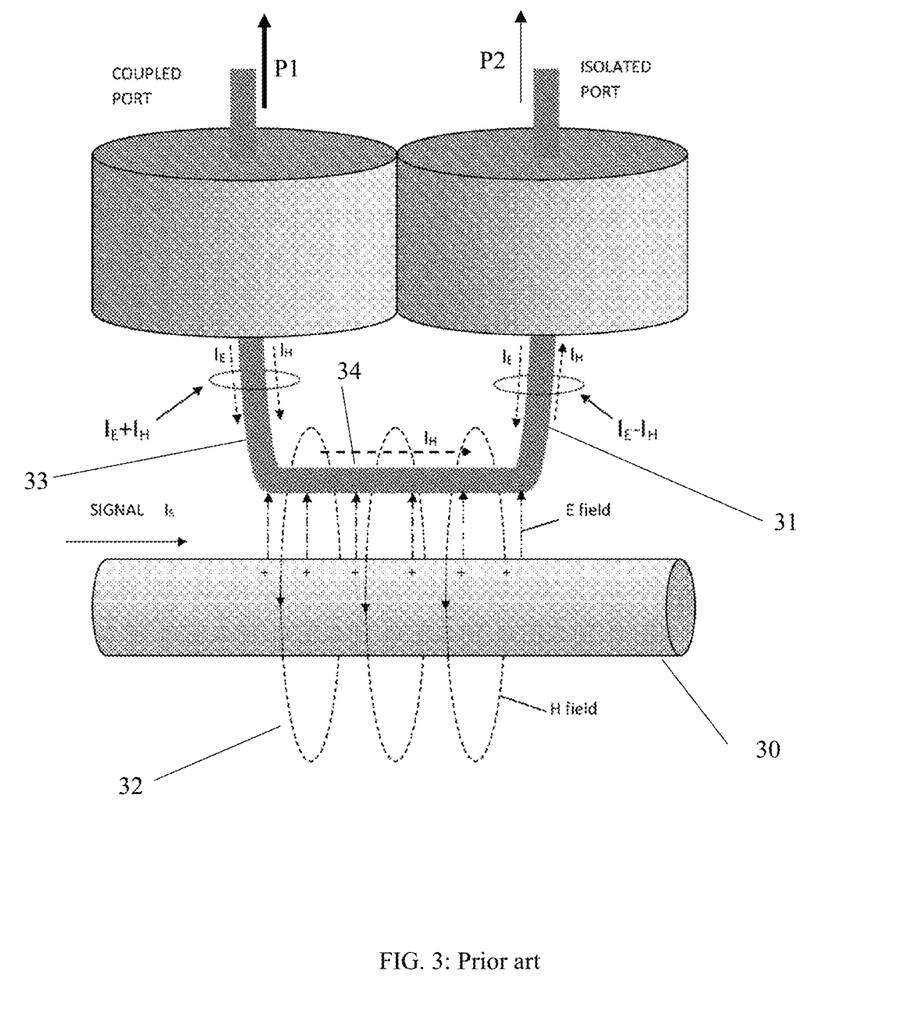
FIG. 3 depicts prior art, magnetically induced and capacitively coupled currents inside the coupling loop of a wire coupler.

Since the predominant coupling mechanism is magnetic $I_H$ is always larger than $I_E$. Or, if we can increase $I_E$ the difference $I_H-I_E$ in branch 31 tends towards zero. This increases isolation and directivity. At the same time, it also increases $I_H+I_E$; this increases forward coupling. The objective is therefore to increase $I_E$.

Figure 5:
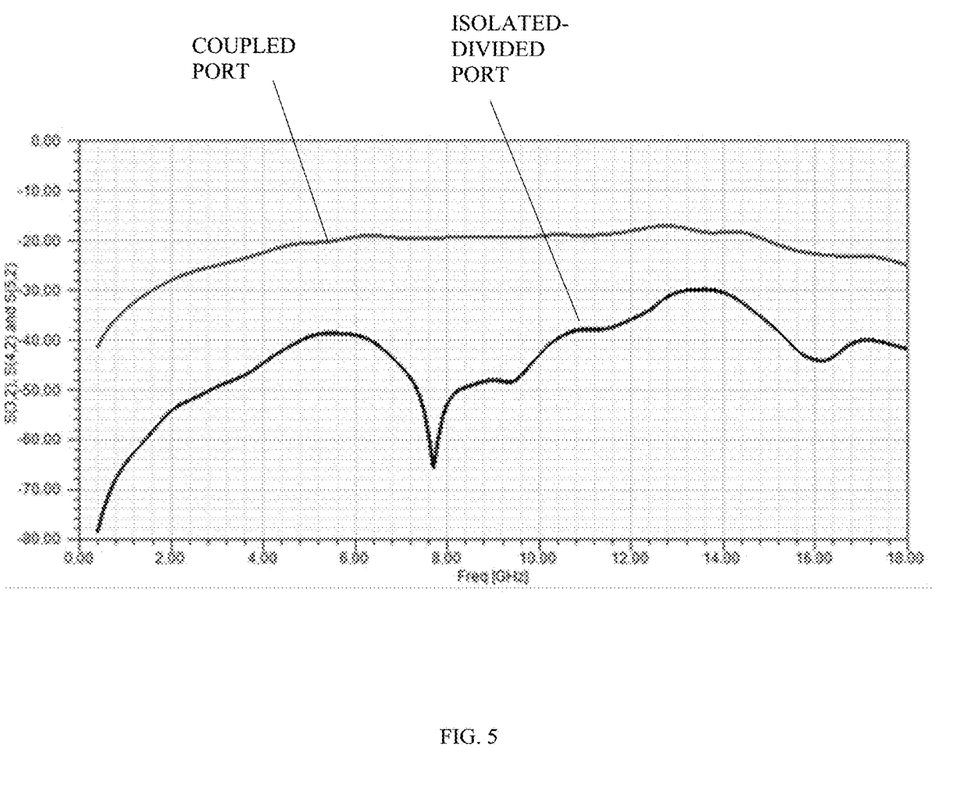
FIG. 5 depicts coupling, isolation, and division characteristics of the embodiment of the present invention.

FIG. 5 shows wideband behavior of the simple coupler divider from a few hundred MHz up to 18 GHz and beyond. Directivity is, as expected between 10 and, mostly, 20 dB. The emphasized area 60 in FIG. 6 (see ref. 8) shows the embodiment of an application where the implementation of a coupler-divider, with inherently larger bandwidth, as shown in FIG. 4, saves an external power-divider/combiner. The coupler-divider samples signal for instantaneous wave measurement by the vector network analyzer and splits, at the same time, part of the signal into the active feedback loop.

Figure 8:
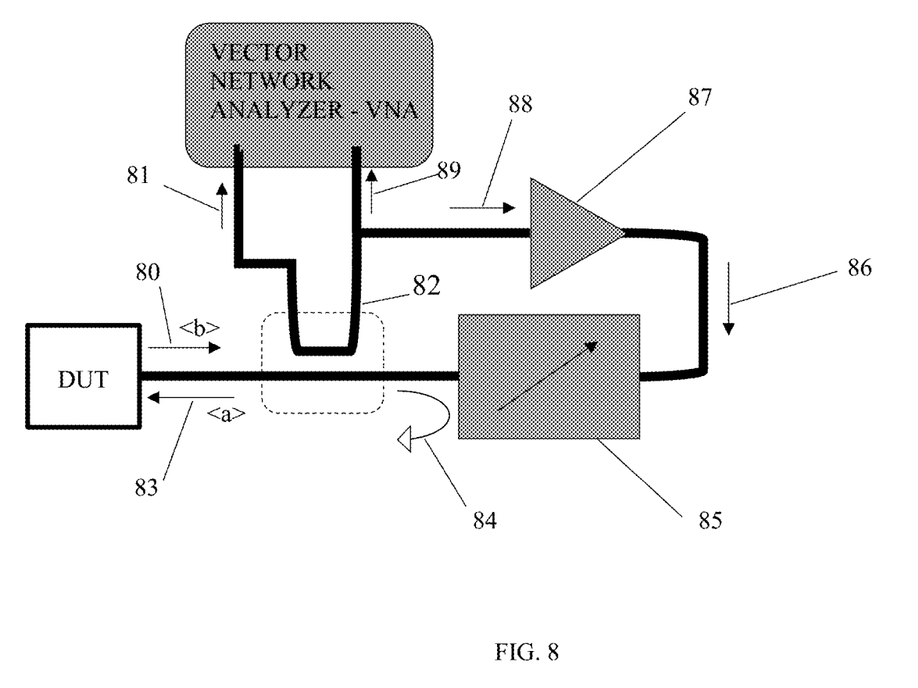
FIG. 8 depicts a common implementation and embodiment of the signal coupler-divider in a hybrid (active plus passive) vector load pull tuner system.

This double function of the coupler-divider is best demonstrated in FIG. 8: The outgoing signal 80 from the DUT is split by the coupler into branches 81 and 82; branch 82 is split into branch 88 and 89; branches 81 and 89 are fed into the ports of the VNA to measure instantaneously the power waves 80 and 83 and calculate the actual reflection factor <a>/<b> at the ports of the DUT, generated by the active feedback loop 88-87-86 including the coupler and the amplifier 87 in combination with the passive pre-matching passive tuner 85, which, in itself creates an added passive reflection 84.

Figure 9A:
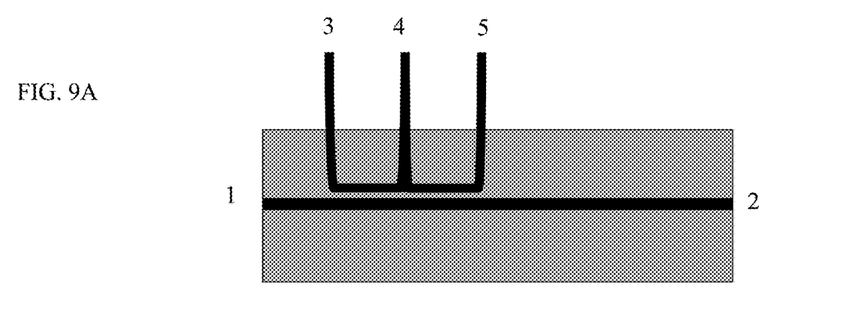
Figure 9B:
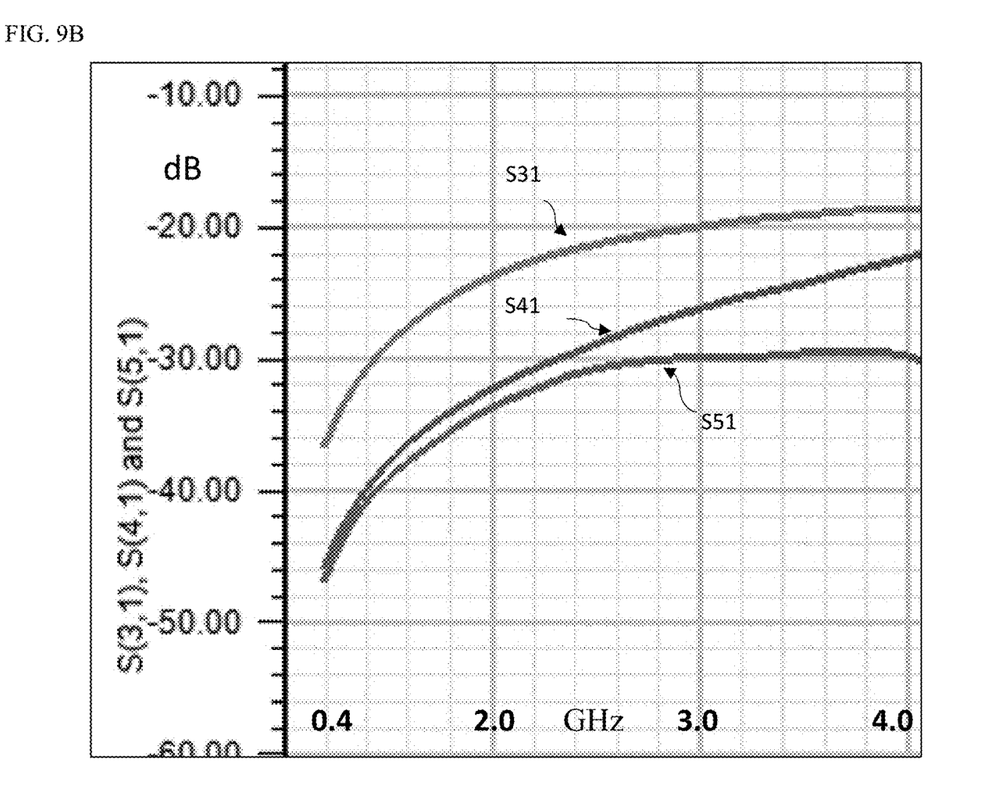

FIG. 9A depicts an alternative embodiment of the signal coupler-divider device; in this case the two wire loops are joined and have a common central branch, leading to originally used isolation port 4; port 5 is the second branch of the second wire loop and leads to the division port 5. Ports 1 and 2 are, as before, input and output ports of the slotted airline and port 3 is the original coupled port. The specific coupler has been designed to reach to low frequencies below 1 GHz, but the concept is valid for any frequency range and covers at least one frequency decade Fmax/Fmin=10, as shown in FIG. 9B.

FIG. 7 is a view of an implementation of the signal coupler-divider as part of the passive tuner, showing that the test setup of FIG. 8 could be further simplified, if the coupler-divider were integrated inside the tuner housing.

In conclusion the new coupler-divider embodiment is superior in coupling to alternative embodiments and superior in directivity. Obvious alternatives and modifications to the herein disclosed general concept of the use of a wire coupler with one spit branch for making a wideband coupling-dividing and high directivity wire coupler shall not impede in the validity of the invention.

What is claimed is:

1. A directional RF signal coupler-divider comprising
   d) an input port, an output port, a coupled port, an isolated port and a divided port,
   e) a transmission airline with a slot, a signal conductor between the input and output ports, and
   f) two "U" shaped electro-magnetic wire loop sensors, a first wire loop sensor and a second wire loop sensor, said wire loop sensors having each a bottom section and two branches, a first branch and a second branch, said "U" shaped wire loop sensors being inserted into the slot of the airline and coupled contactless with the signal conductor;
wherein
   the bottom sections of the "U" shaped wire loop sensors run parallel to the signal conductor, the second branch of the first wire loop sensor being joined with the first branch of the second wire loop sensor;
and wherein
   the first branch of the first wire loop sensor leads to the coupled port, the second branch of the first wire loop sensor and the first branch of the second wire loop sensor are joined and form a common branch leading to the isolated port, and the second branch of the second wire loop sensor leads to the divided port,
and wherein
   each branch extends into forming a center conductor of a coaxial cable terminating into a coaxial port.

2. The directional signal coupler-divider of claim 1, wherein
   the signal conductor is cylindrical.

3. The directional signal coupler-divider of claim 1, wherein
   a characteristic impedance of the transmission airline is 50 Ohms.

* * * * *